United States Patent
Kapoglis et al.

(10) Patent No.: US 11,542,417 B2
(45) Date of Patent: Jan. 3, 2023

(54) CONDUCTIVE RESIN COMPOSITION, CONDUCTIVE ADHESIVE, AND SEMICONDUCTOR DEVICE

(71) Applicant: NAMICS CORPORATION, Niigata (JP)

(72) Inventors: Irma Yolanda Kapoglis, Byfield, MA (US); Masayoshi Otomo, Niigata (JP)

(73) Assignee: NAMICS CORPORATION

( * ) Notice: Subject to any disclaimer, the term of this patent is extended or adjusted under 35 U.S.C. 154(b) by 0 days.

(21) Appl. No.: 17/287,833

(22) PCT Filed: Oct. 28, 2019

(86) PCT No.: PCT/JP2019/042214
§ 371 (c)(1),
(2) Date: Apr. 22, 2021

(87) PCT Pub. No.: WO2020/090757
PCT Pub. Date: May 7, 2020

(65) Prior Publication Data
US 2021/0380850 A1 Dec. 9, 2021

Related U.S. Application Data

(60) Provisional application No. 62/751,997, filed on Oct. 29, 2018.

(51) Int. Cl.
*C09J 9/02* (2006.01)
*C09J 11/04* (2006.01)
*C09J 175/14* (2006.01)
*H01L 23/00* (2006.01)
*C08K 3/08* (2006.01)

(52) U.S. Cl.
CPC .............. *C09J 9/02* (2013.01); *C09J 11/04* (2013.01); *C09J 175/14* (2013.01); *H01L 24/29* (2013.01); *C08K 2003/0806* (2013.01); *C08K 2201/001* (2013.01); *H01L 2224/2919* (2013.01); *H01L 2224/29339* (2013.01)

(58) Field of Classification Search
CPC .......... C08F 290/06; C08K 2003/0806; C08K 2201/001; C09J 11/04; C09J 175/14;
(Continued)

(56) References Cited

U.S. PATENT DOCUMENTS 4,561,950 A 12/1985 Leo
5,132,052 A * 7/1992 Cobbledick ......... C08F 290/064
252/511
(Continued)

FOREIGN PATENT DOCUMENTS

JP S60252665 A 12/1985
JP H07157523 A 6/1995
(Continued)

OTHER PUBLICATIONS

International Search Report (English and Japanese) of the International Searching Authority issued in PCT/JP2019/042214, dated Jan. 21, 2020; ISA/JP (7 pages).

*Primary Examiner* — Mark Kopec
*Assistant Examiner* — Jaison P Thomas
(74) *Attorney, Agent, or Firm* — Harness, Dickey & Pierce, P.L.C.

(57) ABSTRACT

A low temperature rapid curing type low elastic conductive adhesive is provided which is useful as a conductive adhesive for component mounting in a field of FHE. The conductive resin composition contains (A) at least two types of urethane acrylate oligomers, (B) a radical polymerizable monomer, (C) a free radical generation curing agent, and (D) conductive particle. In the conductive resin composition, the component (A) preferably contains a high molecular weight urethane acrylate oligomer having a weight average molecular weight of 10,000 or more (A1), and a low molecular weight urethane acrylate oligomer having a weight average molecular weight of 9,999 or less (A2).

12 Claims, 4 Drawing Sheets

(58) Field of Classification Search
CPC ............ C09J 2203/326; C09J 2301/408; C09J
2433/00; C09J 2475/00; C09J 9/02; H01L
21/52; H01L 2224/2919; H01L
2224/29339; H01L 2224/32225; H01L
2224/32245; H01L 2224/8385; H01L
2224/83862; H01L 24/29; H01L 24/32;
H01L 24/83; H01L 2924/0781
See application file for complete search history.

(56) References Cited

U.S. PATENT DOCUMENTS

| | | | |
|---|---|---|---|
| 5,519,070 A | 5/1996 | Watanabe et al. | |
| 2010/0186823 A1* | 7/2010 | Hsu | H01B 1/22 257/E31.124 |
| 2019/0177579 A1 | 6/2019 | Ota et al. | |

FOREIGN PATENT DOCUMENTS

| | | |
|---|---|---|
| JP | 2005-113059 A | 4/2005 |
| JP | 2006-22312 A | 1/2006 |
| JP | 2011-510139 A | 3/2011 |
| JP | 2012-72238 A | 4/2012 |
| JP | 2016-25305 A | 2/2016 |
| JP | 2017-210457 A | 11/2017 |
| JP | 2018-27944 A | 2/2018 |
| JP | 2018-048286 A | 3/2018 |
| WO | 2009-128530 A1 | 10/2009 |
| WO | 2013-035685 A1 | 3/2013 |
| WO | 2018-003704 A1 | 1/2018 |

\* cited by examiner

CONDUCTIVE RESIN COMPOSITION, CONDUCTIVE ADHESIVE, AND SEMICONDUCTOR DEVICE

CROSS REFERENCE TO RELATED APPLICATIONS

This application is a U.S. National Phase Application under 35 U.S.C. 371 of International Application No. PCT/JP2019/042214, filed on Oct. 28, 2019, which claims the benefit of U.S. Patent Application No. 62/751,997, filed on Oct. 29, 2018. The entire disclosures of the above applications are expressly incorporated by reference herein.

BACKGROUND

Technical Field

The present invention relates to a conductive resin composition, a conductive adhesive containing the conductive resin composition, and a semiconductor device including these cured products. In particular, the present invention relates to a conductive resin composition, a conductive adhesive containing the conductive resin composition, and a semiconductor device including these cured products, which can be used in a field of flexible hybrid electronics.

Related Art

In a field of flexible hybrid electronics (hereinafter, referred to as FHE), a flexible and low-elasticity conductive adhesive for mounting components such as a sensor and a capacitor on a flexible wiring board is required.

Further, in the field of FHE, since a semi-conductor such as a processor or a memory mounted on the flexible wiring board cannot have elasticity, the low-elasticity conductive adhesive for mounting the semi-conductor on the flexible wiring board is also required.

For example, as a conductive epoxy resin adhesive for bonding an LED chip or an LD chip to a lead frame, "a curable resin composition containing (a) a polyimide silicone resin having two or more phenolic acid groups in one molecule, (b) an epoxy resin, and (c) a conductive metal powder" is reported (JP-A-2005-113059). However, although this curable resin composition is a low-temperature curable conductive adhesive, there is a problem that peeling or cracking occur in the adhesive since this curable resin composition is not low in elasticity, that is, has no flexibility.

Further, for a purpose of achieving a B-stage (semi-curing) at a relatively low temperature without distilling off a solvent or performing light emission and obtaining a sufficient adhesive strength when cured (C-stage) thereafter, "a conductive resin composition containing (d) an epoxy resin, (e) a compound having a (meth)acryloyl group and a glycidyl group, (f) a phenol resin-based curing agent, (g) a radical polymerization initiator, and (h) a conductive particle" is reported (WO-2013/035685). However, although this conductive resin composition is cured at a low temperature of about 150° C., it is not suitable for the field of FHE because an elastic modulus of a cured product is high.

On the other hand, as an object of providing a conductive adhesive having high conductivity while having good flexibility and a manufacturing method thereof, and a method for manufacturing a conductive material using the conductive adhesive, a "conductive adhesive containing (i) a polyether polymer having a main chain having a repeating unit represented by a formula of —R$^1$—O— [wherein the formula, R$^1$ is a hydrocarbon group having 1 to 10 carbon atoms.] and a terminal group which is a hydrolyzable silyl group, and (j) a silver particle" is reported (JP-A-2018-048286). However, although the conductive adhesive has flexibility, there are problems that a curing temperature is high (about 185° C.) and a resistance value is high.

Further, as a purpose of providing a conductive adhesive capable of improving an adhesive strength, a heat dissipation, and an ultraviolet ray resistance and curing at a low temperature, "a conductive adhesive containing a conductive powder, a thermosetting silicone resin, and a solvent" is reported (JP-T-2011-510139). However, the conductive adhesive has problems that a curing temperature is high (200° C.×60 minutes) and a resistance value is high.

As described above, the low temperature rapid curing type low elastic conductive adhesive, which is currently required as a conductive adhesive for component mounting in the field of FHE, does not have sufficient characteristics. An object of the present invention is to provide a low temperature rapid curing type low elastic conductive adhesive which is useful as a conductive adhesive for component mounting in a field of FHE.

SUMMARY

The present invention relates to a conductive resin composition, a conductive adhesive, and a semiconductor device that solve the above problems by having the following configurations.

[1] A conductive resin composition contains:
(A) at least two types of urethane acrylate oligomers;
(B) a radical polymerizable monomer;
(C) a free radical generation curing agent; and
(D) a conductive particle.

[2] The conductive resin composition according to [1] described above, in which the component (A) contains a high molecular weight urethane acrylate oligomer having a weight average molecular weight of 10,000 or more (A1), and a low molecular weight urethane acrylate oligomer having a weight average molecular weight of 9,999 or less (A2).

[3] The conductive resin composition according to [1] or [2] described above, in which the component (B) contains a monofunctional radically polymerizable monomer (B1) and a polyfunctional radically polymerizable monomer (B2).

[4] The conductive resin composition according to [3], in which the polyfunctional radically polymerizable monomer (B2) has two or more (meth)acryloyl groups in one molecule, and has, between the two adjacent (meth)acryloyl groups, an alkylene skeleton having 4 to 30 carbon atoms in a straight chain or an oxyalkylene skeleton having 4 to 30 carbon atoms in the straight chain.

[5] The conductive resin composition according to any one of [1] to [4] described above, in which the component (C) is a peroxide.

[6] The conductive resin composition according to [5] described above, in which the peroxide of the component (C) has a 10-hour half-life temperature of 165° C. or less.

[7] The conductive resin composition according to any one of [1] to [6] described above, in which the component (D) is 10 to 50% by volume with respect to 100% by volume of the conductive resin composition.

[8] The conductive resin composition according to any one of [1] to [7] described above, in which the component (D) is a silver particle.

[9] A conductive adhesive contains the conductive resin composition according to any one of [1] to [8] described above.

[10] A semiconductor device contains a cured product of the conductive resin composition according to any one of [1] to [8] described above.

Advantageous Effects of Invention

According to the present invention, the conductive resin composition suitable for a low temperature rapid curing type low elastic conductive adhesive useful as a conductive adhesive for component mounting in the field of FHE can be provided.

According to the present invention, the low temperature rapid curing type low elastic conductive adhesive useful as the conductive adhesive for component mounting in the field of FHE can be provided. According to the present invention, a highly reliable semiconductor device can be obtained by using a cured product of the conductive resin composition suitable for the low temperature rapid curing type low elastic conductive adhesive useful as the conductive adhesive for component mounting in the field of FHE.

DETAILED DESCRIPTION

Figure 1:
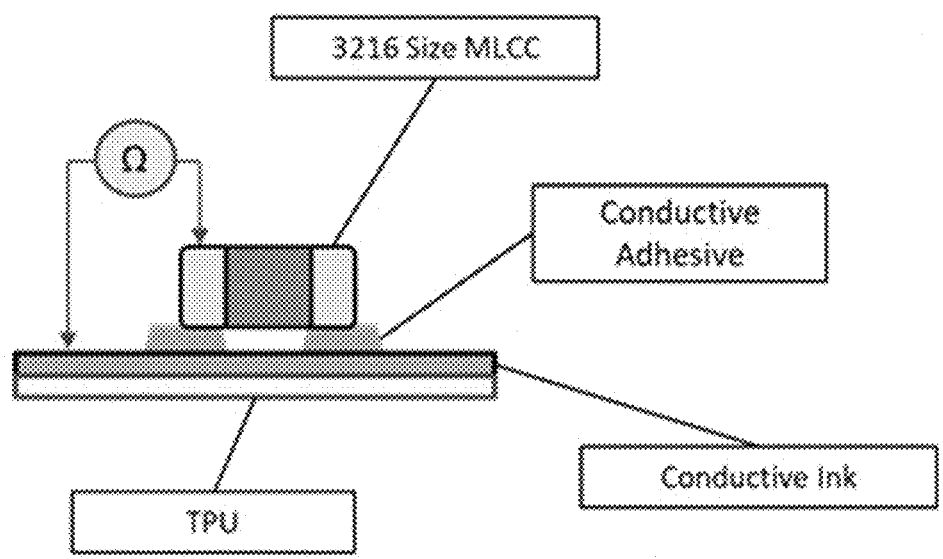
FIG. 1 is a diagram showing a method of measuring a change in electrical resistance due to an elongation rate.

A conductive resin composition of the present invention contains:
(A) at least two types of urethane acrylate oligomers,
(B) a radical polymerizable monomer,
(C) a free radical generation curing agent, and
(D) a conductive particle.

The at least two types of urethane acrylate oligomers, which forms the component (A), provide appropriate elastic modulus, an electrical characteristic, good handleability of the conductive resin composition, and good workability for a cured conductive resin composition. The component (A) preferably contains the at least two types of urethane acrylate oligomers having different weight average molecular weights from each other, from a viewpoint of the elastic modulus, the electrical characteristic, the good handleability of the conductive resin composition, and the workability of the cured conductive resin composition. The component (A) preferably contains a high molecular weight urethane acrylate oligomer having a weight average molecular weight of 10,000 or more (A1), and a low molecular weight urethane acrylate oligomer having a weight average molecular weight of 9,999 or less (A2). Here, the weight average molecular weight (Mw) refers to a polystyrene-equivalent weight average molecular weight using a calibration curve of standard polystyrene by a gel permeation chromatography (GPC) method. When the component (A1) and the component (A2) are used in combination as the component (A), the handleability of the conductive resin composition is excellent, the workability is not impaired, and a low elasticity and a good extensibility of the cured conductive resin composition can be obtained.

The weight average molecular weight of the high molecular weight urethane acrylate oligomer having a weight average molecular weight of 10,000 or more (A1) is preferably in a range of 10,000 to 200,000, more preferably in a range of 11,000 to 150,000, still more preferably in a range of 13,000 to 100,000, and particularly preferably in a range of 14,000 to 80,000. When one type of component in the component (A) is the high molecular weight urethane acrylate oligomer having a weight average molecular weight of 10,000 or more, the low elasticity and the good extensibility of the cured conductive resin composition can be obtained.

The weight average molecular weight of the low molecular weight urethane acrylate oligomer having a weight average molecular weight of 9,999 or less (A2) is preferably 500 or more, more preferably 800 or more, still more preferably 1,000 or more, preferably 8,500 or less, and more preferably 8,000 or less. When one type of component in the component (A) is the low molecular weight urethane acrylate oligomer having a weight average molecular weight of 9,999 or less, the good workability can be maintained without impairing the handleability of the conductive resin composition, and the low elasticity and the good extensibility of the cured conductive resin composition can be obtained.

Examples of a commercially available product of the component (A1) include a urethane acrylate oligomer (product name: CN9071) manufactured by Sartomer and a urethane acrylate oligomer (product name: CNJ966J75) manufactured by Sartomer. As the component (A1), one type may be used alone, or two or more types may be used in combination.

Examples of a commercially available product of the component (A2) include a urethane acrylate oligomer (product name: UN-6200) manufactured by Negami Kogyo Co., Ltd., and a urethane acrylate oligomer (product name: Beamset 577) manufactured by Arakawa Chemical Industry Co., Ltd. As the component (A2), one type may be used alone, or two or more types may be used in combination.

The radical polymerizable monomer as the component (B) provides the appropriate elastic modulus, the electrical characteristic, the good handleability of the conductive resin composition, and the good workability for the cured conductive resin composition. Further, by using the component (B) and the component (A1) together, a cured product can be obtained having a low elastic modulus, a large elongation rate, and flexibility after being cured while maintaining good handleability of the conductive resin composition and the good workability. The component (B) preferably contains a monofunctional radically polymerizable monomer (B1) and a polyfunctional radically polymerizable monomer (B2) from the viewpoint of the appropriate elastic modulus and the electrical characteristic of the cured conductive resin composition, and the handleability of the conductive resin composition.

By containing the monofunctional radically polymerizable monomer (B1) as the component (B), reactivity of the conductive resin composition can be improved, the handleability of the conductive resin composition is good, and the good workability can be maintained.

Since the conductive resin composition contains the polyfunctional radically polymerizable monomer (B2) as the component (B), the relatively long-chain component (B2) can improve the reactivity of the conductive resin composition without significantly changing the elastic modulus of the cured conductive resin composition.

The polyfunctional radically polymerizable monomer (B2) preferably has two or more (meth)acryloyl groups in one molecule, and has, between the adjacent (meth)acryloyl groups, an alkylene skeleton having 4 to 30 carbon atoms in a straight chain or an oxyalkylene skeleton having 4 to 30 carbon atoms in the straight chain. When the polyfunctional radically polymerizable monomer (B2) preferably has two or more (meth)acryloyl groups in one molecule, and has, between the adjacent (meth)acryloyl groups, the alkylene skeleton having 4 to 30 carbon atoms in the straight chain or the oxyalkylene skeleton having 4 to 30 carbon atoms in the straight chain, the cured product having a low elastic modulus, a large elongation rate, and an appropriate flexibility can be obtained after being cured. When the number of carbon atoms of the straight chain of the alkylene skeleton or the oxyalkylene skeleton between the adjacent (meth)acryloyl groups of the polyfunctional radically polymerizable monomer (B2) is 4 to 30, a cured product can be obtained which has a relatively long-chain skeleton, in which a storage elastic modulus of the cured conductive resin composition is specifically 1 GPa or less, which has a low elastic modulus and a large elongation rate, and is flexible and has good elongation. When the number of carbon atoms in the straight chain constituting the skeleton between the adjacent (meth) acryloyl groups of the polyfunctional radically polymerizable monomer (B2) is 3 or less, the flexibility of the cured product is affected, and the elongation rate of the cured conductive resin composition may decrease. When the number of carbon atoms in the straight chain constituting the skeleton between the adjacent (meth)acryloyl groups of the polyfunctional radically polymerizable monomer (B2) exceeds 30, the reactivity may decrease due to steric hindrance, the handleability of the conductive resin composition may be good, and the good workability may decrease. An alkylene group or an oxyalkylene group between the adjacent (meth)acryloyl groups of the polyfunctional radical polymerization monomer (B2) may have a branched chain when the number of carbon atoms in the straight chain is 4 to 30.

Examples of the component (B1) include, for example, isobornyl acrylate (also known as (1R,2R,4R)-rel-1,7,7-trimethylbicyclo[2.2.1]heptane-2-yl=acrylate) represented by the following formula (1). As the component (B1), one type may be used alone, or two or more types may be used in combination.

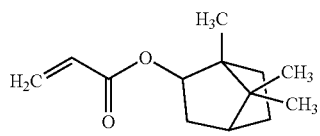

(1)

Examples of a commercially available product of the component (B1) include isobornyl acrylate (product name: SR506A) manufactured by Sartomer.

Examples of the component (B2) include dipropylene glycol diacrylate, and polyethylene glycol diacrylate represented by the following formula (2) in which n in the formula (2) is an integer from 2 to 15.

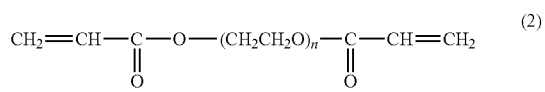

In formula (2), n is the integer from 2 to 15.

Examples of a commercially available product of the component (B2) include dipropylene glycol diacrylate (product name: SR508N) manufactured by Sartomer, polyethylene glycol diacrylate (product name: Light Acrylate 9EG-A, and product name: Light Acrylate 14EG-A) manufactured by Kyoeisha Chemical Co., Ltd. As the component (B2), one type may be used alone, or two or more types may be used in combination.

The free radical generation curing agent which is the component (C) cures the component (A) and the component (B). The component (C) is preferably a peroxide from a viewpoint of the reactivity with the component (A) and the component (B).

When the component (C) is the peroxide, the peroxide of the component (C) preferably has a 10-hour half-life temperature of 165° C. or less. When the component (C) is the peroxide and has the 10-hour half-life temperature of 165° C. or less, the conductive resin composition can be cured at a relatively low temperature, and an electronic component can be mounted on a flexible wiring board using the conductive resin composition without damaging the electronic component due to heat. The 10-hour half-life temperature refers to a temperature at which a time until the peroxide is decomposed and an amount thereof becomes ½ is 10 hours. When the component (C) is the peroxide, the peroxide preferably has a 10-hour half-life temperature of 30° C. or more. When the 10-hour half-life temperature of the peroxide of the component (C) is less than 30° C., the reactivity between the component (A) and the component (B) is too high, and stability may decrease.

Examples of a commercially available product of the peroxide of the component (C) include peroxydicarbonate (product name: Parloyl TCP, NOF CORPORATION, 10-hour half-life temperature: 40.8° C.), 1,1,3,3-tetramethylbutylperoxy-2-ethylhexane art (product name: PEROCTA 0, NOF CORPORATION, 10-hour half-life temperature: 65.3° C.), t-butyl cumyl peroxide (product name: PERBUTYL C, NOF CORPORATION, 10-hour half-life temperature: 119.5° C.), dicumyl peroxide (product name: Percumyl D, NOF CORPORATION, 10-hour half-life temperature: 116.4° C.), dilauroyl peroxide (product name: Parloyl L, NOF CORPORATION, 10-hour half-life temperature: 61.6° C.), dibenzoyl peroxide (product name: NIPER FF, NOF CORPORATION, 10-hour half-life temperature: 73.6° C.), 1,1-di(t-hexylperoxy)cyclohexane (product name: PERHEXA HC, manufactured by NOF CORPORATION, 10-hour half-life temperature: 87.1° C.), 2,5-dimethyl-2,5-di(t-butyl-peroxy)hexane (product name: PERHEXA 25B, NOF CORPORATION, 10-hour half-life temperature: 117.9° C.), t-butylperoxy-2-ethylhexyl monocarbonate (product name: PERBUTYL E, NOF CORPORATION, 10-hour half-life temperature: 99.0° C.), α,α'-di (t-butyl-peroxy)diisopropylbenzene (product name: PERBUTYL P, NOF CORPORATION, 10-hour half-life temperature: 119.2° C.), n-Butyl 4,4-di(t-butyl-peroxy) valerate (product name: PERHEXA V, NOF CORPORATION, 10-hour half-life temperature: 104.5° C.), t-hexylperoxyisopropyl monocarbonate (product name: Perhexyl I, NOF CORPORATION, 10-hour half-life temperature: 95.0° C.), t-butyl peroxylaurate (product name: PERBUTYL, NOF CORPORATION, 10-hour half-life temperature: 98.3° C.), 2,2-di(t-butyl-peroxy)butane (product name: PER-HEXA 22, NOF CORPORATION, 10-hour half-life temperature: 103.1° C.).

The conductive particle which is the component (D) provides the conductivity to the conductive resin composition. As the component (D), known conductive particles in the related art such as a metal particle of gold, silver, nickel, copper, solder, a carbon particle, or a plastic particle plated with metal can be used.

As the component (D), the silver particle is preferable from a viewpoint of conductivity. A shape of the conductive particle is not particularly limited, but is preferably a flake shape from a viewpoint of reducing decomposition of the component (C) due to the conductivity and an oxidation-reduction reaction. Here, the flake shape refers to a shape in which a ratio (aspect ratio) of "long diameter/short diameter" is 2 or more, and includes a flat plate shape such as a plate shape or a scale shape. The long diameter and the short diameter of the particle constituting the conductive particle are obtained based on an image obtained from a scanning electron microscope (SEM) (n=20). The "long diameter" refers to a longest diameter among line segments passing through a substantial center of gravity of the particle in the particle image obtained by the SEM, and the "short diameter" refers to a shortest diameter among the line segments passing through the substantial center of gravity of the particle in the particle image obtained by the SEM. A shape of the silver particle may be a combination of silver particles having different shapes.

When the component (D) is the silver particle, a tap density is preferably 2.0 g/cm$^3$ or more, and more preferably 3.0 to 6.0 g/cm$^3$. Here, the tap density is measured in accordance with JIS Z 2512 metal powder-tap density measurement method. When the tap density of the silver particle is too low, the silver particles tends to be difficult to disperse in the cured product of the conductive resin composition at a high density, and the conductivity of the cured product is likely to decrease. On the other hand, when the tap density of the silver particle is too high, separation and precipitation of the silver particle are likely to occur in the conductive resin composition.

When the component (D) is the silver particle, from a viewpoint of the conductivity and fluidity of the conductive resin composition, an average particle diameter ($D_{50}$) is preferably 0.05 to 50 µm, more preferably 0.1 to 20 µm, and most preferably 0.1 to 15 µm. Here, the average particle diameter refers to a particle diameter (median diameter) having a cumulative frequency of 50% in a volume-based particle size distribution measured by a laser diffraction method.

When the component (D) is the silver particle, a specific surface area of the silver particle is preferably 1.5 m$^2$/g or less, and more preferably 0.1 to 0.6 m$^2$/g. Here, the specific surface area is measured by a BET method. When the specific surface area of the silver particle is too large, when the silver particle is made into a paste, viscosity is likely to increase, the handleability is likely to decrease, and the workability is likely to decrease. On the other hand, when the specific surface area of the silver particle is too small, a contact area between the silver particles is small and the conductivity decreases.

Examples of a commercially available product of the component (D) include a silver powder (product name: AA-9829N) manufactured by Metalor Technologies SA. As the component (D), one type may be used alone, or two or more types may be used in combination.

With respect to 100 parts by mass of a total of the component (A), the component (B), and the component (C), the component (A) is preferably 20 to 79.9 parts by mass, and more preferably 40 to 62 parts by mass from a viewpoint of improving adhesion to a metal case. When an amount of the component (A) is too small, the elastic modulus is likely to increase, that is, the flexibility is likely to decrease, and when the amount of the component (A) is too large, the viscosity increases, the handleability decreases, and the workability is likely to decrease. Alternatively, a resistance value is likely to increase due to an influence of the steric hindrance of the component (A).

Further, with respect to 100 parts by mass of a total of the component (A), the component (B), and the component (C), the component (A1) is preferably 10 to 40 parts by mass, and preferably 20 to 40 parts by mass. With respect to 100 parts by mass of the total of the component (A), the component (B), and the component (C), the component (A2) is preferably 10 to 60 parts by mass, and more preferably 20 to 40 parts by mass. Here, when a ratio of the high molecular weight urethane acrylate oligomer (A1) is too low, that is, when a ratio of the low molecular weight urethane acrylate oligomer is too high, the elastic modulus is likely to increase, that is, the flexibility is likely to decrease. On the other hand, in an opposite case, when the ratio of the high molecular weight urethane acrylate oligomer (A1) is too high, that is, when the ratio of the low molecular weight urethane acrylate oligomer is too low, the handleability and the good workability of the conductive resin composition and the electrical characteristic of the cured conductive resin composition decrease.

With respect to 100 parts by mass of the total of the component (A), the component (B), and the component (C), the component (B) is preferably 20 to 70 parts by mass, and more preferably 35 to 60 parts by mass. When an amount of the component (B) is too small, the viscosity of the conductive resin composition is high, the handleability of the conductive resin composition decreases, the workability is likely to decrease, and the reactivity is also likely to decrease. When the amount of the component (B) is too large, the viscosity of the conductive resin composition decreases, and the conductive particle precipitates in the conductive resin composition, resulting in a decrease in dispersibility. When the amount of the component (B) is too large, the elastic modulus is likely to increase, and the flexibility is likely to be lost.

Further, when the component (B1) and the component (B2) are used, with respect to 100 parts by mass of the component (B), the component (B1) is preferably 30 to 70 parts by mass, and more preferably 40 to 60 parts by mass, and the component (B2) is preferably 30 to 70 parts by mass, and more preferably 40 to 60 parts by mass. When a ratio of the polyfunctional radically polymerizable monomer (B2) is too low, the reactivity decreases, and an influence of oxygen inhibition is easily seen. When the ratio of the polyfunctional radically polymerizable monomer (B2) is too high, the viscosity increases, the handleability decreases, and the workability is likely to decrease. The "oxygen inhibition" used here refers to a phenomenon unique to a radical polymerization system, and refers to a phenomenon in which a free radical, which is an active site, is trapped by an oxygen radical in an air during radical polymerization, the free radical is deactivated, and a radical polymerization reaction stops at a time when the free radical is deactivated. When the ratio of the polyfunctional radically polymerizable monomer (B2) is too low, due to the oxygen inhibition, a reaction is difficult to proceed on a surface of the cured product of the conductive resin composition due to an influence of the oxygen inhibition, and the surface of the cured product may remain in an uncured state. It is preferable that the polyfunctional radically polymerizable monomer is used such that radical polymerization can proceed before the free radical is trapped by the oxygen radical by increasing the radical polymerization reactivity.

With respect to 100 parts by mass of a total of the component (A) and the component (B), the component (B) is preferably 20 parts by mass or more and less than 80 parts by mass, more preferably 25 to 79 parts by mass, still more preferably 30 to 75 parts by mass, and particularly preferably 35 to 70 parts by mass. When the component (B) is 20 parts by mass or more and less than 80 parts by mass with respect to 100 parts by mass of the total of the component (A) and the component (B) in the conductive resin composition, a cured product can be obtained having an excellent flexibility with a low elastic modulus and a large elongation rate while maintaining the appropriate viscosity of the conductive resin composition and maintaining the good handleability of the conductive resin composition and the good workability without lowering dispersibility of the conductive particle (D).

With respect to 100 parts by mass of the total of the component (A), the component (B), and the component (C), the component (C) is preferably 0.1 to 30 parts by mass, and more preferably 3 to 10 parts by mass. When the amount of the component (C) is too small, a curing reactivity is likely to decrease. When the amount of the component (C) is too large, the unreacted component (C) may remain in the cured product of the conductive resin composition after the conductive resin composition is cured, or residual heat generation may be observed after the conductive resin composition is cured.

When the silver particle is used as the component (D), the component (A), the component (B), and the component (C) are preferably 5 to 50 parts by mass, and more preferably 12 to 30 parts by mass, with respect to 100 parts by mass of the conductive resin composition.

The component (D) is preferably 10 to 50% by volume, and more preferably 20 to 44% by volume, with respect to 100% by volume of the conductive resin composition. When an amount of the component (D) is too small, the conductivity of the cured conductive resin composition is likely to decrease, and in some cases, conduction cannot be achieved. When the amount of the component (D) is too large, an amount of a resin component in the conductive resin composition decreases, which may affect the elastic modulus (that is, the flexibility), the adhesive strength. A volume of the component (D) can be calculated based on a content (mass basis) and a specific gravity of each of the component (A), the component (B), the component (C), and the component (D).

When the resin composition only includes the components (A) to (D), the content (volume part) of the component (D) can be calculated by a thermogravimetric analysis (TGA). When a temperature of the conductive resin composition is raised to 600 to 900° C. to decompose and volatilize the resin component, only the component (D) remains, and a mass of the component (D) contained in the conductive resin composition can be measured. By subtracting a mass of a filler from a mass of the conductive resin composition, the masses of the components (the component (A) to the component (C)) other than the component (D) can be calculated. Thereafter, the specific gravities of the component (D) and the components other than the component (D) are measured by the Archimedes method, and the volume of each component can be calculated by dividing a previously obtained mass by the specific gravity.

When the silver particle is used as the component (D), the component (D) is preferably 50 to 95 parts by mass, and more preferably 70 to 88 parts by mass, with respect to 100 parts by mass of the conductive resin composition.

The conductive resin composition may further contain, if necessary, a thixotropic agent for improving the workability, a coupling agent, a pigment such as carbon black, an ion trapping agent, a dye, a defoamer, a defoaming agent, an antioxidant, a polymerization inhibitor, other additives, a reactive diluent, an organic solvent, and the like as long as the object of the present invention is not impaired.

The conductive resin composition of the present invention can be obtained, for example, by stirring, melting, mixing, and dispersing the components (A) to (D) and, if necessary, the other additives and the like simultaneously or separately while performing heating processing as necessary. Devices for mixing, stirring, dispersing are not particularly limited, and a grinding machine equipped with a stirring and heating device, a three-roll mill, a ball mill, a planetary mixer, a bead mill can be used. These devices may be used in combination as appropriate.

A conductive adhesive of the present invention is preferably cured at 60 to 180° C., more preferably 70 to 175° C., and still more preferably 75 to 170° C. The conductive adhesive is preferably cured for 1 to 150 minutes, more preferably 5 to 120 minutes, and still more preferably 10 to 90 minutes.

The storage elastic modulus of the cured conductive resin composition is preferably 0.01 to 2.5 GPa because concentration of stress can be avoided.

Conductive Adhesive

The conductive adhesive of the present invention contains the conductive resin composition described above. This conductive adhesive is very suitable for use in the field of FHE and in applications of a conductive adhesive of an electronic textile.

Semiconductor Device

A semiconductor device of the present invention includes the cured product of the conductive resin composition described above. Examples of the semiconductor device include those for a field of HE and an electronic textile (e-textile).

EXAMPLES

The present invention will be described with reference to an example, but the present invention is not limited thereto. In the following examples, "parts" and "%" indicate "parts by mass" and "% by mass", respectively, unless otherwise specified.

The following raw materials were used.

(A) urethane acrylate oligomer component (A1): high molecular weight urethane acrylate oligomer having a weight average molecular weight of 10,000 or more (A1-1): urethane acrylate oligomer (product name: CN9071) manufactured by Sartomer, weight average molecular weight Mw: 24,000.

(A1-2): urethane acrylate oligomer (product name: CN9071) manufactured by Sartomer, weight average molecular weight Mw: 14,000.

component (A2): low molecular weight urethane acrylate oligomer having a weight average molecular weight of 9,999 or less (A2-1): urethane acrylate oligomer (product name: UN-6200) manufactured by Negami Kogyo Co., Ltd., weight average molecular weight Mw: 6,500.

(A2-2): urethane acrylate oligomer (product name: Beamset 577) manufactured by Arakawa Chemical Industry Co., Ltd., weight average molecular weight Mw: about 1,000.

Each of the weight average molecular weights (Mws) of the urethane acrylate oligomer (A) refers to a polystyrene-equivalent weight average molecular weight using a calibration curve of standard polystyrene by a gel permeation chromatography (GPC) method.

(B) radical polymerizable monomer, component (B1): monofunctional radically polymerizable monomer (B1-1): isobornyl acrylate (product name: SR506A) manufactured by Sartomer component (B2): polyfunctional radically polymerizable monomer (B2-1): dipropylene glycol diacrylate (product name: SR508) manufactured by Sartomer, represented by the following formula (2), in the following formula (2), n is 2, and the number of carbon atoms in the straight chain between two adjacent (meth)acryloyl groups is 4.

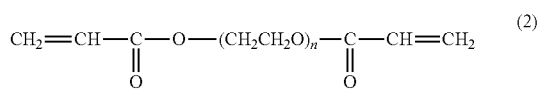

(B2-2): polyethylene glycol diacrylate (product name: Light Acrylate 9EG-A (bifunctional)) manufactured by Kyoeisha Chemical Co., Ltd., represented by the following formula (2), in the formula (2) described above, n is 9, and the number of carbon atoms in the straight chain between the two adjacent (meth)acryloyl groups is 18.

(B2-3): polyethylene glycol diacrylate (product name: Light Acrylate 14EG-A (bifunctional)) manufactured by Kyoeisha Chemical Co., Ltd., represented by the following formula (2), in the formula (2) described above, n is 14, and the number of carbon atoms in the straight chain between the two adjacent (meth)acryloyl groups is 28.

(B2'-4): neopentyl glycol diacrylate (product name: Light Acrylate NP-A (bifunctional)) manufactured by Kyoeisha Chemical Co., Ltd., represented by the following formula (3), and the number of carbon atoms in the straight chain between the two adjacent (meth)acryloyl groups is 3.

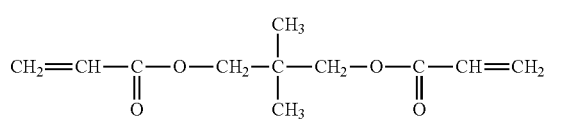

(B2'-5): trimethylolpropane triacrylate (product name: SR305 (tri-functional)) manufactured by Sartomer, represented by the following formula (4), and the number of carbon atoms in the straight chain between two adjacent (meth)acryloyl groups is 3.

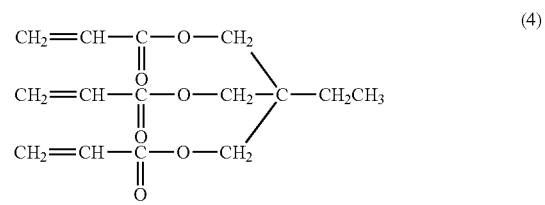

(C) free radical generation curing agent: peroxide (C-1) peroxydicarbonate (product name: Parloyl TCP, 10-hour half-life temperature: 40.8° C.) manufactured by NOF CORPORATION.

(C-2) 1,1,3,3-tetramethylbutylperoxy-2-ethylhexane art (product name: PEROCTA 0, 10-hour half-life temperature: 65.3° C.) manufactured by NOF CORPORATION.

(C-3) dicumyl peroxide (product name: Percumyl D, 10-hour half-life temperature: 116.4° C.) manufactured by NOF CORPORATION. (C-4) t-Butyl hydroperoxide (product name: Percumyl H, manufactured by NOF CORPORATION, 10-hour half-life temperature: 166.5° C.) manufactured by NOF CORPORATION.

(D) Conductive Particle component (D): silver powder (product name: AA-9829N, flake shape, average particle diameter: 10.1 μm, tap density: 5.0 g/cm$^3$, specific surface area: 0.2 m$^2$/g) manufactured by Metalor Technologies SA.

Example 1

7.7 parts by mass of the component (A1), 4.2 parts by mass of the component (A2), 3.7 parts by mass of the component (B1), 3.7 parts by mass of the component (B2), 0.80 parts by mass of the component (C), and 80.00 parts by mass of the component (D) were mixed using a three-roll mill to prepare a conductive resin composition.

Examples 2 to 14

The component (A1), the component (A2), the component (B1), the component (B2), the component (C), and the component (D) were mixed in a formulation shown in Table 1 using the three-roll mill to prepare a conductive resin composition.

Comparative Example 1

6.72 parts by mass of the component (A1), 6.72 parts by mass of the component (B1), 0.56 parts by mass of the component (C), and 86.00 parts by mass of the component (D) were mixed using the three-roll mill to prepare a conductive resin composition.

Each of the conductive resin compositions of the example and the comparative example and each of the cured conductive resin compositions were evaluated as follows. Results are shown in Tables 1 and 2.

Evaluation

Measurement of Viscosity

Viscosity of each of the conductive resin compositions of the example and the comparative example was measured at 10 rpm using a brook field B viscosity meter (model number: DV3T, cone spindle: CPA-52Z, cone plate temperature: 25° C.).

Measurement of Die Shear Strength

An FR4 was prepared as a substrate, and a Si die of 3 mm was prepared as a die. A conductive resin composition was printed on the FR4 (glass epoxy) substrate using a polyimide film stencil (thickness: 120 μm) having a hole having a diameter of 2 mm. Thereafter, the Si die of 3 mm was mounted and cured in an air conventional oven at 80° C. for 30 minutes to prepare a sample for die shear strength measurement. The Die Shear Strength was measured (n=10) at a room temperature using a desktop strength tester (model number: 4000PLUS-CART-S200KG) manufactured by Nodson DAGE. For each of the example and the comparative example, ten samples for die shear strength measurement were measured, and arithmetic mean values thereof were taken as the die shear strengths.

Measurement of Specific Resistance

Two tapes having a thickness of about 85 to 95 μm were attached to a glass substrate in parallel at an interval of 3 mm, and a conductive resin composition film having a width of 3 mm, a length of 50 mm, and a thickness of about 90 μm was printed between the two tapes, and then cured in an air conventional oven at 80° C. for 30 minutes. After a film thickness of the cured conductive resin composition film was measured, a resistance value was measured by a four-terminal method, and a specific resistance was obtained.

Measurement of Storage Elastic Modulus

The conductive resin composition was applied onto a glass slide to which a Teflon tape was attached such that the film thickness when cured was 200±50 μm to form a coating film, and the coating film was allowed to stand in the air conventional oven at 80° C. for 30 minutes to be cured. The coating film was peeled off from a stainless steel plate and then cut into a predetermined size (20 mm×5 mm) with a cutter. A cut was smoothly finished with sandpaper. This coating film was measured in accordance with JIS C6481 using a viscoelasticity measuring device (DMA) (model number: DMS7100) manufactured by Hitachi High-Tech Science Co., Ltd. under conditions of a deformation mode: tension, measurement mode: ramp, frequency: 10 Hz, strain amplitude: 5 μm, minimum tension/compression force: 50 mN, tension/compression force gain: 1.2, initial value of force amplitude: 50 mN, movement waiting time: 8 seconds, creep waiting time coefficient: 0, and 25° C.

Measurement of Change in Electrical Resistance Due to Elongation Rate

FIG. 1 is a diagram showing a method of measuring a change in electrical resistance due to an elongation rate. A stretchable conductive silver paste for a circuit manufactured by Namics Co., Ltd., mix was screen-printed on a thermoplastic polyurethane sheet (product name: ST-604) (TPU) manufactured by BEMIS Inc. so as to have a film thickness after drying of 15 to 25 μm, and then dried at 120° C. for 30 minutes to form a conductive ink layer. After a pattern (conductive adhesive) of the prepared conductive resin composition was formed on the conductive ink layer using a stencil (polyimide stencil, film thickness: 120 μm) having a hole having a diameter of 1 mm, a multi-layer ceramic capacitor (MLCC) of 3216 size was mounted, and the pattern was cured in an air conventional oven at 80° C. for 30 minutes to prepare a sample. Thereafter, as shown in FIG. 1, an electric resistance value between one electrode of the MLCC of 3216 size and the conductive ink layer was measured by a four-terminal method using a digital multimeter.

Figure 2:
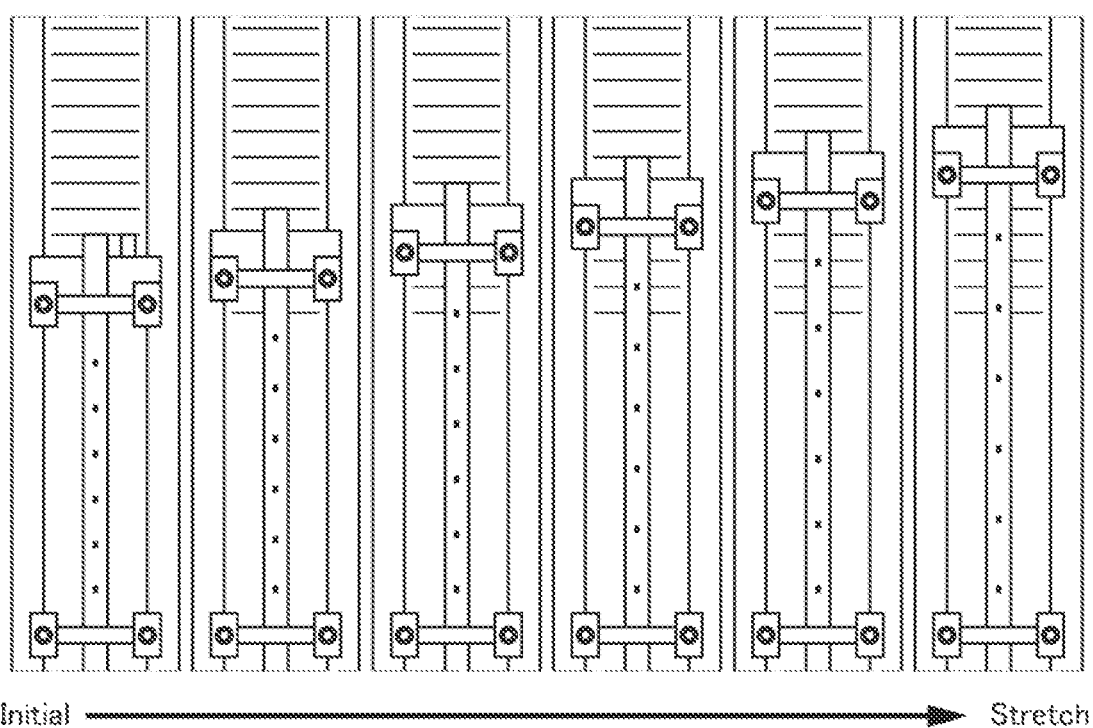
FIG. 2 is a diagram showing a method of measuring the elongation rate.

FIG. 2 is a diagram showing a method of measuring the elongation rate. As shown in a leftmost part of FIG. 2, the sample was fixed using a stretching tool, and the electrical resistance between one electrode of the MLCC and the conductive ink layer was measured by the four-terminal method. Thereafter, the sample was stretched by 10% with the stretching tool and fixed, and the electric resistance value between one electrode of the MLCC and the conductive ink layer was measured using the digital multimeter each time. Table 1 shows the elongation rate until the MLCC is detached from the TPU.

Reliability Evaluation

Storage Elastic Modulus after HTHH (High Temperature and High Humidity)

Figure 3:
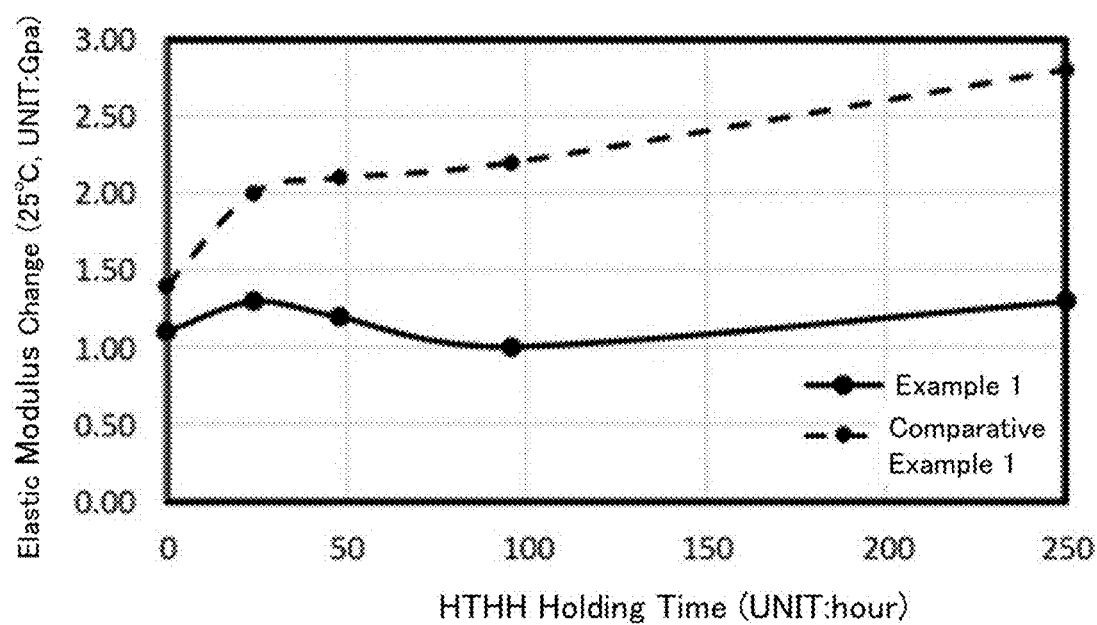
FIG. 3 is a diagram showing a change in an elastic modulus after a cured product is held at HTHH (85° C./85%).

Reliability of the sample prepared in a similar manner as in the method of measuring the elastic modulus was evaluated. The sample was held at a high temperature and a high humidity (HTHH) of 85° C./85% for 24, 48, 96, and 250 hours, and then a resistance value was measured at 25° C. Next, the elastic modulus was measured at 25° C. FIG. 3 shows a relationship between an HTHH holding time and an elastic change in Example 1 and Comparative Example 1.

Resistance Value Change (Magnification)

Figure 4:
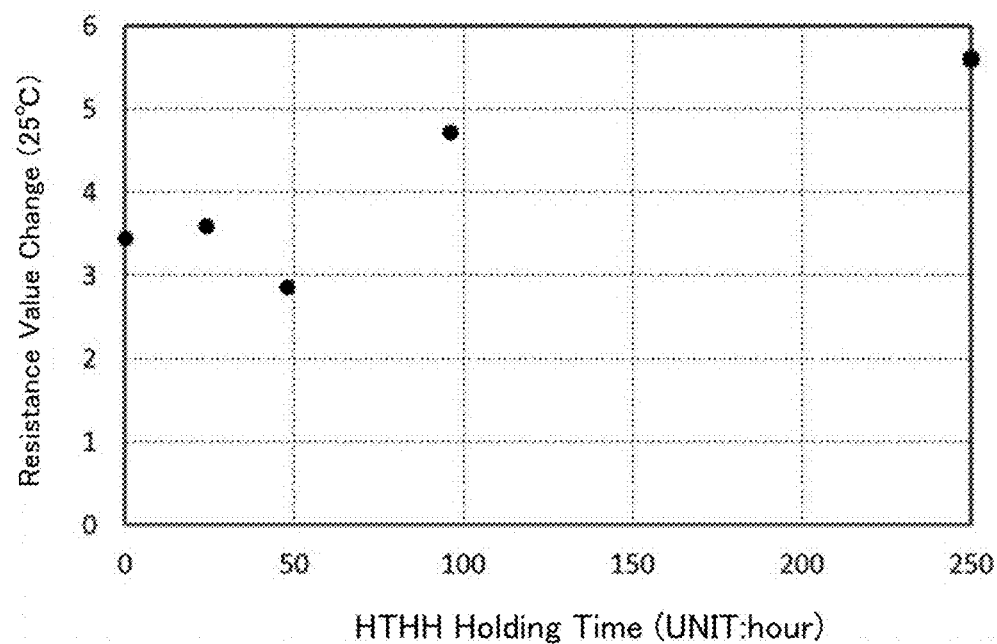
FIG. 4 is a diagram showing a resistance value change of Example 1 in which a cured product is stretched by 20% after being held at HTHH (85° C./85%).

Next, the sample prepared in a similar manner as in the method of measuring the storage elastic modulus was held at a high temperature and a high humidity (HTHH) of 85° C./85% for 24, 48, 96, and 250 hours, the sample was extended by 20%, and then the resistance value was measured at 25° C. Next, a resistance value change (magnification) when the resistance value before the HTHH was set to 1 was obtained. FIG. 4 shows a relationship between the HTHH holding time and the resistance value change in Example 1.

TABLE 1

|   |   |   |   | Comparative Example 1 | Example 1 | Example 2 | Example 3 | Example 4 | Example 5 |
|---|---|---|---|---|---|---|---|---|---|
| A1 | A1-1 | Weight average | 24,000 | | 6.7 | 7.7 | 7.7 | 7.7 | — | — |
|   | A1-2 | molecular weight | 14,500 | — | — | 4.2 | — | 7.7 | — |
| A2 | A2-1 | (Mw) | 6,500 | — | 4.2 | — | — | 4.2 | 7.7 |
|   | A2-2 |   | About 1,000 | — | — | — | 4.2 | — | 4.2 |
| B1 | B1-1 | The number of carbon | — | 6.7 | 3.7 | 3.7 | 3.7 | 3.7 | 3.7 |
| B2 | B2-1 | atoms between adjacent | 4 | — | 3.7 | 3.7 | 3.7 | 3.7 | 3.7 |
|   | B2-2 | (meth)acryloyl groups | 18 | — | — | — | — | — | — |
|   | B2-3 |   | 28 | — | — | — | — | — | — |
| B2' | B2'-4 |   | 3 | — | — | — | — | — | — |
|   | B2'-5 |   | 3 | — | — | — | — | — | — |
| C | C-1 | 10-hour half-life | 40.8 | 0.6 | 0.8 | 0.8 | 0.8 | 0.8 | 0.8 |
|   | C-2 | temperature (° C.) | 65.3 | — | — | — | — | — | — |
|   | C-3 |   | 119.5 | — | — | — | — | — | — |
|   | C-4 |   | 166.5 | — | — | — | — | — | — |
| D | D |   |   | 86.0 | 80.0 | 80.0 | 80.0 | 80.0 | 80.0 |
| Viscosity [Pa · s] |   |   |   | 38 | 21 | 113 | 23 | 31 | 17 |
| Die shear strength [N/mm²] |   |   |   | 8.1 | 9 | 8.8 | 10.1 | 7 | 10.9 |

TABLE 1-continued

|  |  | Comparative Example 1 | Example 1 | Example 2 | Example 3 | Example 4 | Example 5 |
|---|---|---|---|---|---|---|---|
| Specific resistance [×10$^{-4}$ Ω·m] | | 3.6 | 3.4 | 3.6 | 2.9 | 3.9 | 2.0 |
| Storage elastic modulus [Gpa] | | 1.6 | 0.9 | 0.9 | 1.0 | 0.8 | 2.7 |
| Elongation rate [%] | | 10 | 20 | 30 | 20 | 30 | 10 |
| Storage elastic modulus after HTHH (85° C./85% RH) [Gpa] | 0 h | 1.6 | 0.9 | 0.9 | 1.0 | 0.8 | 2.7 |
| | 24 h | 2 | 1.3 | 1.0 | 1.0 | 1.2 | 2.8 |
| | 48 h | 2.1 | 1.2 | 1.2 | 1.1 | 1.4 | 2.7 |
| | 96 h | 2.2 | 1 | 1.1 | 1.5 | 1.3 | 2.8 |
| | 250 h | 2.8 | 1.6 | 1.3 | 1.8 | 1.7 | 2.8 |
| Resistance value change after HTHH (85° C./85% RH) [magnification] | 0 h | — | 3.4 | 5.0 | 8.0 | 2.8 | — |
| | 24 h | — | 3.6 | 5.2 | 7.5 | 3.0 | — |
| | 48 h | — | 2.9 | 4.6 | 8.1 | 3.2 | — |
| | 96 h | — | 4.7 | 5.7 | 8.3 | 3.0 | — |
| | 250 h | — | 5.6 | 5.5 | 9.5 | 5.8 | — |

As can be seen from Table 1, in Example 1, the sample was cured at a low viscosity for a short time of 30 minutes at a low temperature of 80° C., and in a curing atmosphere, the Die Shear Strength in the air was high, the specific resistance was low, the storage elastic modulus was low, and the resistance value change was small even after elongation at the elongation rate of 20%. In contrast, in Comparative Example 1, the storage elastic modulus was high. Further, in Comparative Example 1, after the elongation at the elongation rate of 20%, the MLCC was detached from the TPU.

As can be seen from FIG. 3, in Example 1, a change in the storage elastic modulus was small after the HTHH holding. In contrast, in Comparative Example 1, the change in the storage elastic modulus after the HTHH holding was large. Further, as can be seen from FIG. 4, in Example 1, the resistance value change was not so large even after 20% elongation after the HTHH holding, and the reliability was maintained. Although not shown in FIG. 4, a resistance value change after 20% elongation of Comparative Example 1 was 3.58 before the HTHH, and after the HTHH holding, the MLCC was detached from the TPU after 20% elongation, and the resistance value could not be measured.

Since in the Examples 1, 3, and 4, both of the high molecular weight urethane acrylate oligomer having a weight average molecular weight of 10,000 or more (A1) and the low molecular weight urethane acrylate oligomer having a weight average molecular weight of 9,999 or less (A2) are contained, a cured product can be obtained having a high die shear strength, a low specific resistance, a low storage elastic modulus, a high elongation rate, and a low elasticity and a good extensibility without impairing the handleability of the conductive resin composition. In Example 2, since two types of high molecular weight urethane acrylate oligomers having the average molecular weight of 10,000 or more were contained, the viscosity of the conductive resin composition was as high as 100 Pa·s or more, the handleability decreased, and the workability was affected. In Example 5, since two types of low molecular weight urethane acrylate oligomers having the average molecular weight of 9,999 or less were contained, as the number of cross-linking points increased, a cross-linking density increased, and the elastic modulus of the cured conductive resin composition became higher than 2.5 GPa.

The cured conductive resin compositions of Examples 1 to 4 had a storage elastic modulus of 2.0 G-Pa or less even after being held at the HTHH for 250 hours. The cured conductive resin composition of Example 5 did not have a significant change in the storage elastic modulus even after being held at the HTHH for 250 hours. On the other hand, the cured conductive resin composition of Comparative Example 1 had a storage elastic modulus exceeding 2.5 GPa after being held at the HTHH for 250 hours.

Further, in the cured conductive resin compositions in Examples 1 to 4, the longer a time of holding HTHH is, the larger the change in the resistance value after 20% elongation as compared to a state where the sample was not elongated before being held at HTHH.

TABLE 2

| | | | | Example 6 | Example 7 | Example 8 | Example 9 | Example 10 | Example 11 | Example 12 | Example 13 | Example 14 |
|---|---|---|---|---|---|---|---|---|---|---|---|---|
| A1 | A1-1 | Weight average molecular weight (Mw) | 24,000 | 7.7 | 7.7 | 7.7 | 7.7 | 7.7 | 7.7 | 7.7 | 9.9 | 2.5 |
| | A1-2 | | 14,500 | — | — | — | — | — | — | — | — | — |
| A2 | A2-1 | | 6,500 | 4.2 | 4.2 | 4.2 | 4.2 | 4.2 | 4.2 | 4.2 | 5.4 | 1.3 |
| | A2-2 | | About 1,000 | — | — | — | — | — | — | — | — | — |
| B1 | B1-1 | The number of carbon atoms between adjacent (meth)acryloyl groups | — | 3.7 | 3.7 | 3.7 | 3.7 | 3.7 | 3.7 | 3.7 | 1.9 | 7.7 |
| B2 | B2-1 | | 4 | — | — | — | — | 3.7 | 3.7 | 3.7 | 1.9 | 7.7 |
| | B2-2 | | 18 | — | 3.7 | — | — | — | — | — | 3.84 | — |
| | B2-3 | | 28 | — | — | 3.7 | — | — | — | — | — | — |
| B2' | B2'-4 | | 3 | 3.7 | — | — | — | — | — | — | — | — |
| | B2'-5 | | 3 | — | — | — | 3.7 | — | — | — | — | — |
| C | C-1 | 10-hour half-life temperature (° C.) | 40.8 | 0.8 | 0.8 | 0.8 | 0.8 | — | — | — | 0.8 | 0.8 |
| | C-2 | | 65.3 | — | — | — | — | 0.8 | — | — | — | — |
| | C-3 | | 119.5 | — | — | — | — | — | 0.8 | — | — | — |
| | C-4 | | 166.5 | — | — | — | — | — | — | 0.8 | — | — |
| D | D | | | 80.0 | 80.0 | 80.0 | 80.0 | 80.0 | 80.0 | 80.0 | 80.0 | 80.0 |
| Viscosity [Pa·s] | | | | 24 | 35 | 37 | 40 | 18 | 19 | 22 | 36 | 2 |
| Die shear strength [N/mm$^2$] | | | | 8.2 | 4.5 | 4.7 | 6.4 | 5.5 | 3.4 | — | 6.6 | 10.7 |
| Specific resistance [×10$^{-4}$ Ω·m] | | | | 4.9 | 5.0 | 6.6 | 1.2 | 8.5 | 8.3 | — | 9.6 | 5.9 |
| Storage elastic modulus [Gpa] | | | | 1.3 | 0.1 | 0.1 | 1.5 | 0.8 | 0.7 | — | 0.5 | 2.6 |

TABLE 2-continued

|  |  | Example 6 | Example 7 | Example 8 | Example 9 | Example 10 | Example 11 | Example 12 | Example 13 | Example 14 |
|---|---|---|---|---|---|---|---|---|---|---|
| Elongation rate [%] |  | 10 | 20 | 20 | 10 | 20 | 20 | — | 30 | 10 |
| Storage elastic modulus after HTHH (85° C./85% RH) [Gpa] | 0 h | 1.3 | 0.1 | 0.1 | 1.5 | 0.8 | 0.7 | — | 0.5 | 2.6 |
|  | 24 h | 1.7 | 0.4 | 0.4 | 1.8 | 1.2 | 1.1 | — | 0.7 | 2.7 |
|  | 48 h | 1.7 | 0.5 | 0.4 | 2.0 | 1.1 | 1.0 | — | 0.6 | 2.8 |
|  | 96 h | 1.8 | 0.8 | 0.6 | 2.1 | 1.3 | 1.1 | — | 0.9 | 3.0 |
|  | 250 h | 2.0 | 1.0 | 0.9 | 2.6 | 1.5 | 1.4 | — | 1.0 | 3.4 |
| Resistance value change after HTHH (85° C./85% RH) [magnification] | 0 h | — | 4.2 | 6.1 | — | 4.3 | 5.1 | — | 5.8 | — |
|  | 24 h | — | 4.3 | 6.4 | — | 4.5 | 5.6 | — | 4.9 | — |
|  | 48 h | — | 3.9 | 6.7 | — | 4.5 | 4.8 | — | 5.5 | — |
|  | 96 h | — | 3.7 | 5.9 | — | 5.1 | 5.8 | — | 6.0 | — |
|  | 250 h | — | 4.5 | 6.6 | — | 6.0 | 7.0 | — | 6.3 | — |

In Examples 7 and 8, since the monofunctional radically polymerizable monomer (B1) and the polyfunctional radically polymerizable monomer (B2) are contained, the polyfunctional radically polymerizable monomer (B2) has two or more (meth)acryloyl groups in one molecule, and has an oxyalkylene skeleton having 4 to 30 carbon atoms in a straight chain between two adjacent (meth)acryloyl groups, the cured conductive resin composition had a low elastic modulus and a large elongation rate, and had an appropriate flexibility. The cured conductive resin compositions of Examples 7 and 8 had a storage elastic modulus of 2.0 G-Pa or less even after being held at HTHH (high temperature and high humidity) for 250 hours. Further, in the cured conductive resin compositions in Examples 7 and 8, even if the time of being hold at HTHH was as long as 250 hours, the change in the resistance value after 20% elongation was small as compared to the state where the sample was not elongated before being held at HTHH.

In Examples 6 and 9, since the monofunctional radically polymerizable monomer (B1) and the polyfunctional radically polymerizable monomer (B2') having two or more (meth)acryloyl groups in one molecule and having an oxyalkylene skeleton having 3 carbon atoms in a straight chain between two adjacent (meth)acryloyl groups, the elastic modulus of the cured conductive resin composition was higher than that of Examples 6 and 9, and the elongation rate was 10%.

In Examples 10 and 11, since the free radical generation curing agent (C) is a peroxide and has a 10-hour half-life temperature of 165° C. or less, the free radical generation curing agent was cured at a low temperature of 80° C. for a short time of 30 minutes, and the cured product can be obtained having a high die shear strength of the cured conductive resin composition, a low specific resistance, a low storage elastic modulus, a high elongation rate, and a low elasticity and a good extensibility without impairing the handleability of the conductive resin composition. The cured conductive resin compositions of Examples 10 and 11 had a storage elastic modulus of 2.0 G-Pa or less even after being held at the HTHH for 250 hours. Further, as the time for holding the cured conductive resin compositions in Examples 10 and 11 at HTHH was as long as 250 hours, the larger the change in the resistance value after 20% elongation as compared to a state where the sample was not elongated before being held at HTHH.

In Example 12, since the free radical generation curing agent (C) was a peroxide and had a 10-hour half-life temperature exceeding 165° C., the free radical generation curing agent was not cured at a low temperature of 80° C. for a short time of 30 minutes.

In Example 13, since the component (B) is 20 parts by mass with respect to 100 parts by mass of the total of the component (A) and the component (B) in the conductive resin composition, the conductive resin composition could maintain a viscosity with good handleability without lowering the dispersibility of the conductive particle (D) in the conductive resin composition, and a cured product could be obtained having a high die shear strength of the cured conductive resin composition, a low specific resistance, a low elastic modulus, a high elongation rate, a good workability, a low elasticity and a good extensibility without impairing the handleability of the conductive resin composition. The cured conductive resin composition of Example 13 had a storage elastic modulus of 2.0 G-Pa or less even after being held at the HTHH for 250 hours. Further, as the time for holding the cured conductive resin composition in Example 13 at HTHH was as long as 250 hours, the larger the change in the resistance value after 20% elongation as compared to a state where the sample was not elongated before being held at HTHH.

In Example 14, the component (B) was 80 parts by mass with respect to the total of 100 parts by mass of the component (A) and the component (B) in the conductive resin composition, the viscosity of the conductive resin composition decreased, the conductive particle (D) precipitated in the conductive resin composition, it was difficult to maintain the dispersibility of the conductive particle (D), the storage elastic modulus of the cured conductive resin composition was high, and the elongation rate was 10%. The cured conductive resin composition of Example 14 had a storage elastic modulus of 3.4 G-Pa after being held at the HTHH for 250 hours.

INDUSTRIAL APPLICABILITY

As described above, the conductive resin composition of the present invention is suitable for a low temperature rapid curing type low elastic conductive adhesive, and is very suitable as a conductive adhesive for component mounting in the field of FHE.

The invention claimed is:
1. A conductive resin composition containing:
(A) at least two types of urethane acrylate oligomers;
(B) a radical polymerizable monomer;
(C) a free radical generation curing agent; and
(D) a conductive particle,
wherein the component (A) contains a high molecular weight urethane acrylate oligomer having a weight average molecular weight of 10,000 or more (A1), and a low molecular weight urethane acrylate oligomer having a weight average molecular weight of 9,999 or less (A2).

2. The conductive resin composition according to claim 1, wherein
the component (B) contains a monofunctional radically polymerizable monomer (B1) and a polyfunctional radically polymerizable monomer (B2).

3. The conductive resin composition according to claim 2, wherein
the polyfunctional radically polymerizable monomer (B2) has two or more (meth)acryloyl groups in one molecule, and has, between the two adjacent (meth)acryloyl groups, an alkylene skeleton having 4 to 30 carbon atoms in a straight chain or an oxyalkylene skeleton having 4 to 30 carbon atoms in the straight chain.

4. The conductive resin composition according to claim 1, wherein the component (C) is a peroxide.

5. The conductive resin composition according to claim 4, wherein the peroxide of the component (C) has a 10-hour half-life temperature of 165° C. or less.

6. The conductive resin composition according to claim 1, wherein the component (D) is 10 to 50% by volume with respect to 100% by volume of the conductive resin composition.

7. The conductive resin composition according to claim 1, wherein the component (D) is a silver particle.

8. A conductive adhesive containing the conductive resin composition according to claim 1.

9. A semiconductor device containing a cured product of the conductive resin composition according to claim 1.

10. A conductive resin composition containing:
(A) at least two types of urethane acrylate oligomers;
(B) a radical polymerizable monomer;
(C) a free radical generation curing agent; and
(D) a conductive particle,
wherein the component (C) is a peroxide, and
the peroxide of the component (C) has a 10-hour half-life temperature of 165° C. or less.

11. A conductive adhesive containing the conductive resin composition according to claim 10.

12. A semiconductor device containing a cured product of the conductive resin composition according to claim 10.

* * * * *